(12) United States Patent
Gross

(10) Patent No.: US 6,380,083 B1
(45) Date of Patent: Apr. 30, 2002

(54) PROCESS FOR SEMICONDUCTOR DEVICE FABRICATION HAVING COPPER INTERCONNECTS

(75) Inventor: Michal Edith Gross, Summit, NJ (US)

(73) Assignee: Agere Systems Guardian Corp., Orlando, FL (US)

(*) Notice: Subject to any disclaimer, the term of this patent is extended or adjusted under 35 U.S.C. 154(b) by 0 days.

(21) Appl. No.: 09/568,265

(22) Filed: May 10, 2000

Related U.S. Application Data

(63) Continuation-in-part of application No. 09/143,037, filed on Aug. 28, 1998, now Pat. No. 6,297,154.

(51) Int. Cl.$^7$ .............................................. H01L 21/44
(52) U.S. Cl. ..................... 438/687; 438/622; 438/660; 438/674; 438/680
(58) Field of Search ................................ 438/622–629, 438/631–633, 637, 641–643, 645, 646, 648, 652, 653, 656, 658, 660, 661, 663, 674, 675, 678, 680, 683, 685, 687

(56) References Cited

U.S. PATENT DOCUMENTS

| | | | |
|---|---|---|---|
| 5,447,887 A | 9/1995 | Filipiak et al. | 437/200 |
| 5,527,739 A | * 6/1996 | Parrillo et al. | 438/627 |
| 5,972,192 A | * 10/1999 | Dubin et al. | 205/101 |
| 5,989,623 A | 11/1999 | Chen et al. | 427/97 |
| 6,054,172 A | * 4/2000 | Robinson et al. | 427/97 |
| 6,054,173 A | * 4/2000 | Robinson et al. | 427/98 |
| 6,126,761 A | * 10/2000 | DeHaven et al. | 148/518 |
| 6,126,989 A | * 10/2000 | Robinson et al. | 427/97 |
| 6,153,522 A | * 11/2000 | Takagi et al. | 438/687 |
| 6,197,181 B1 | * 3/2001 | Chen | 205/123 |

FOREIGN PATENT DOCUMENTS

| | | | |
|---|---|---|---|
| EP | 0982771 | 3/2000 | H01L/21/768 |
| WO | WO99/40615 | 8/1999 | H01L/21/768 |

OTHER PUBLICATIONS

James A. Cunningham, Ph.D.,*Semiconductor International* "A Search for Useful Dopants", Apr. 2000.

\* cited by examiner

*Primary Examiner*—Charles Bowers
*Assistant Examiner*—Asok Kumar Saricar
(74) *Attorney, Agent, or Firm*—Richard J. Botos

(57) ABSTRACT

A process for fabricating a semiconductor device with copper interconnects is disclosed. In the process of the present invention, a layer of dielectric material is formed on a substrate. A barrier layer to prevent copper diffusion is then deposited over the entire surface of the substrate. A dual copper layer is formed on the barrier layer. The dual layer has a copper layer deposited by PVD and a copper layer deposited by electroplating. The copper layers are adjacent to each other. The ratio of the thickness (X) of the electroplated layer to the thickness of the PVD layer (Y) is about 1:0.5 to about 1:2. The thickness of the electroplated layer is at least about 3 $\mu$m. The thickness of the PVD copper layer is at least about 100 nm. The thickness of the two layers is selected to effect recrystallization of the electroplated copper from a small grain size (0.1 $\mu$m to 0.2 $\mu$m) to a large grain size (1 $\mu$m or greater).

9 Claims, No Drawings

US 6,380,083 B1

PROCESS FOR SEMICONDUCTOR DEVICE FABRICATION HAVING COPPER INTERCONNECTS

STATEMENT OF RELATED APPLICATION

This application is a continuation-in-part of U.S. Ser. No. 09/143,037, filed on Aug. 28, 1998 now U.S. Pat. No. 6,297,154.

BACKGROUND OF THE INVENTION

1. Technical Field

This invention is directed to a process for fabricating integrated circuit devices and, in particular, to semiconductor devices that have copper interconnects.

2. Art Background

As devices are scaled to sub-micron dimensions, formation of reliable sub-micron interconnection (interconnects) becomes increasingly difficult. Many techniques have been used to form interconnects. However, as the dimensions of sub-micron interconnects get smaller, present techniques are becoming less useful.

For example, techniques that require the interconnects to be formed by patterning a layer of metal using lithographic techniques, in which the pattern defined in a layer of energy sensitive material is transferred into the underlying metal layer by etch expedient, have several problems. In these techniques, contact holes (windows or vias) are formed in a layer of a dielectric material. The contact holes are then filled with metal by depositing a metal layer over the dielectric layer. The portion of the deposited metal layer overlying the dielectric layer is then removed using an expedient such as etching or chemical mechanical polishing (CMP). The portion of the metal layer that remains is the portion in the contact holes formed in the dielectric layer.

A second layer of metal is then formed over the dielectric layer with the metal-filled contact holes. The second metal layer is patterned to form the interconnect wires in the conventional subtractive process. Typically the metal filling the contact holes is one metal (e.g., CVD (chemical vapor deposited) tungsten) and the patterned metal is a second metal (e.g., aluminum). The second metal layer is patterned using lithographic techniques.

Such a process has certain problems associated therewith. Specifically, the patterned aluminum layer is subject to sidewall corrosion. Also, the spaces between the patterned metal lines must be subsequently filled with a dielectric layer before further processing. Furthermore, the use of dissimilar metals for the interconnects (e.g., tungsten) and the wires (e.g., aluminum) adversely affects both the mechanical strength and the electrical quality of the interconnect.

Copper is currently being introduced as an interconnect material because it has a low cost and a low resistivity. However, it is difficult to etch copper. Therefore processes that require the metal interconnect to be etched are not useful for forming copper interconnects. A promising technique for forming interconnects is a dual damascene process (or a combination of two single damascene processes). In a dual damascene process a single dielectric layer is deposited and patterned using a two-step etch process. The first step etches contact openings through half or more of the dielectric layer thickness and the second etch step etches the contact openings through the remaining dielectric thickness to the underlying layer and also the interconnect channels (i.e., trenches) part way through the dielectric layer.

The dual damascene process is advantageous for copper interconnect formation compared to the conventional subtractive process because, in dual damascene, lithographic techniques and etching expedients are not required to pattern a layer of copper. However, in dual damascene, copper deposition is complicated because the contact openings may have an aspect ratio (i.e. the ratio of the height to the width of the recess) of 2:1, 3:1, or more. The high aspect ratio makes sputter deposition difficult. Copper may be deposited by CVD within the contact openings and interconnect channels. However, copper is difficult and/or expensive to deposit by CVD. As a result, copper is not typically deposited by CVD in production.

Electroless metal deposition (i.e., electroless plating) has been investigated as a technique for depositing copper onto a patterned layer of dielectric material. In this technique the surfaces to be plated (e.g., contact openings (windows or vias) and interconnect channels) must be pretreated before the metal is deposited in order to effect electroless deposition. Low deposition rates and issues of bath stability make this approach unattractive for use in production. In addition, current surface activation techniques such as physical vapor deposition (PVD, e.g., sputtering) of a catalytic metal or treatment with an activating solution are either difficult or incompatible with current processes for device fabrication.

A major advantage of copper is its relatively low cost and low resistivity. However, it has a relatively large diffusion coefficient into silicon, silicon dioxide, and low dielectric constant polymers such as polyimide. Copper from an interconnect may diffuse through the silicon dioxide or polymer layer and into the underlying silicon. Copper diffusion into the underlying silicon substrate can degrade the transistor characteristics of the resulting device. Copper interconnects should be encapsulated by at least one diffusion barrier to prevent diffusion into the silicon dioxide layer. The formation of this diffusion barrier is another problem associated with copper interconnect formation.

As noted in U.S. Pat. No. 5,627,102 to Shinriki et al., one problem associated with the formation of metal interconnects is that voids form in the metal filling the recess. Such faulty fill-up leads to a failure to establish a sound electrical contact. The problem of faulty fill-up increases with increasing aspect ratios. Consequently, as the width of the recess decreases, the problems associated with faulty fill-up increase.

Accordingly, a process for making copper interconnects that addresses the current problems associated with copper interconnect formation is desired.

SUMMARY OF THE INVENTION

In the process of the present invention, two layers of copper are deposited, one on top of the other. One layer is deposited using a vapor deposition techniques such as chemical vapor deposition (CVD) or plasma vapor deposition (PVD). The other layer is deposited by electroplating. The vapor-deposited copper layer and the electroplated copper layer are adjacent. However, it does not matter which layer is the top layer and which layer is the bottom layer. That is, the bottom layer is either the vapor-deposited layer or the electroplated layer. The top layer is the other of the vapor-deposited layer or the electroplated layer.

The present invention is advantageous because it provides a mechanism for recrystallizing vapor-deposited copper when the thickness of the vapor deposited copper layer is thicker than 150 nm. Previously, vapor-deposited copper layers have been used as seed layers for electroplated copper. However, vapor-deposited copper is deposited as a fine grain (0.1 $\mu$m–0.2 $\mu$m) material. Therefore, only thin (i.e. 100 nm or less) layers of vapor-deposited copper were formed because mechanisms for recrystallizing thicker vapor-deposited copper layers to a large grain material (i.e. 1 $\mu$m) that is advantageous for electromigration resistance were not known. However, thicker vapor-deposited layers are advantageous in certain instances. For example, a vapor-deposited layer of copper containing a dopant to reduce electromigration is thicker than 150 nm. Such a layer is deposited as a small-grain film and converted to a large-grain film at low temperature using the process of the present invention.

After the dual copper layer is formed, the copper is recrystallized. Recrystallization of the vapor-deposited layer is controlled by selecting a thickness of the electroplated layer that will cause the vapor-deposited copper layer to recrystallize. The copper electroplating bath is an acid-based copper electroplating bath that contains at least one organic additive in the form of ligands, brighteners, leveling agents, etc. Copper electroplating baths with such additives are well know to one skilled in the art and not discussed in detail herein.

Recrystallization occurs at room temperature or in conjunction with a low-temperature anneal. As used herein, a low-temperature anneal is an anneal that occurs at temperatures less than 300° C. The ratio of the thickness of the electroplated layer (X) to the vapor-deposited layer (Y) is about 1:0.5 to about 1:2. That is, the ratio X:Y is about 1:0.5 to about 1:2.

The electroplated layer has a thickness of at least about 300 nm. Beyond the minimum thickness requirement, the thickness of the electroplated layer is largely a matter of design choice. Since the thickness of the vapor-deposited layer is at least one-half the thickness of the electroplated layer, the thickness of the vapor-deposited layer is at least about 150 nm.

In one embodiment of the process of the present invention, the dual copper layer is deposited into a recess formed in the surface of a dielectric layer on a semiconductor substrate (i.e., a single damascene process). The dielectric layer may be a material such as silicon dioxide or a low dielectric constant polymer such as, for example, polyimide or polyaryl ethers. For convenience, the recess is referred to as a trench, although one skilled in the art will appreciate that the configuration of the recessed portion is a matter of design choice.

Since copper may diffuse into the dielectric material, a barrier to copper diffusion is typically required. Such a barrier is typically formed on the dielectric layer before the dual copper layer is deposited thereon. However, the barrier may also be formed by doping the copper and by outdiffusing the dopant material to form a barrier layer at the interface between the copper and the dielectric, after the copper is deposited in the recess, to prevent copper diffusion into the adjacent dielectric material. Materials that act as a barrier to copper diffusion are well known to one skilled in the art. Examples of suitable barrier materials include tantalum, tantalum nitride and titanium nitride. The thickness of a barrier layer is at least about 10 nm.

After the barrier layer is formed, the dual copper layer is formed on the substrate. The dual copper layer is formed over the entire surface of the substrate. In the embodiments where the copper is deposited in a trench, the dual copper layer is then polished back so that the only portion of the copper that remains is the portion of the copper in the trench. The electroplated copper layer is polished back using conventional expedients well known to one skilled in the art. Chemical mechanical polishing is one example of a suitable expedient.

Either before or after the electroplated layer of copper is polished, the electroplated copper is recrystallized. If polishing is done before recrystallization there has to be sufficient plated copper still present to drive the recrystallization. The electroplated copper layer is employed to drive the recrystallization of the vapor-deposited copper. The recrystallization is accomplished either at room temperature or in conjunction with a low temperature anneal. Conditions (i.e. PVD copper layer thickness, electroplated copper layer thickness and recrystallization temperature) are selected to bring the grain structure of the electroplated copper from its as-deposited small grain state to a large grain state. For purposes of the present invention, a small grain state is an average grain size of about 0.1 $\mu$m to about 0.2 $\mu$m. A large grain state is a grain size that is at least one micron in at least one dimension.

In the embodiment wherein the copper is deposited into a trench, the grain size is constrained by the size of the recess in which the copper is deposited. For example, when the copper is deposited in a trench having a width of less than one micron, the average large grain size is at least as large as the width of the trench into which the copper is deposited and at least about 1 $\mu$m in the length direction of the trench. Within the defined range, the smaller the grain size when the copper is deposited, the better the fill. However, after the copper is deposited, it is advantageous to increase the grain size of the copper to the large grain state in order to improve the electrical characteristics and the stability of the resulting device.

After the dual copper layer is formed and recrystallized, a passivation layer is formed over the substrate. The passivation layer is intended to prevent the copper interconnect from oxidation and diffusion. One example of a suitable passivation layer material is silicon nitride ($Si_3N_4$).

DETAILED DESCRIPTION

The present invention is directed to a process for forming copper interconnects for semiconductor devices. In the process, the copper is formed on an electrically insulating material (e.g. silicon dioxide, silicon nitride, polymide). The copper is a dual layer, one layer deposited by a vapor deposition technique and one layer deposited by electroplating. The layers are adjacent, but the layers are deposited in either order.

Since copper diffuses into silicon dioxide, a barrier layer is deposited first. The dual layer copper layer is then deposited. In the embodiment where the electroplated copper is deposited first, a seed layer of copper is vapor deposited first. The vapor-deposited layer has a thickness of about 10 nm to about 20 nm. The seed layer acts as a conduction layer for subsequent electroplating. Alternatively, the seed layer is deposited by an electroless plating process.

The selective thickness of the vapor-deposited copper layer and the electroplated copper layer are selected to drive recrystallization of the dual copper layer from its as-deposited small grain size (0.1 $\mu$m–0.2 $\mu$m) to a large grain size ($\geq$1 $\mu$m). The grains of a vapor-deposited film are columnar. The grain size refers to the diameter of the grains, and not the vertical dimension of the grains. The vertical dimension of the grains vary from grain to grain, and the dimension can be as large as the thickness of the film. In one embodiment of the present invention the interconnect is a copper channel formed in the insulating layer by a damascene process.

In this embodiment, a dielectric layer is deposited over a substrate and patterned to form an interconnect channel. An interconnect layer is deposited over the patterned dielectric layer and within the interconnect channel. The substrate is polished with a polishing slurry to remove the portion of the interconnect layer that lies on the patterned dielectric layer, thereby forming the interconnect. Either before or after the interconnect layer is polished, the substrate is annealed. The temperature and duration of the anneal are selected to provide a copper-containing interconnect layer in which the copper has a desired grain size. The interconnect layer may include a barrier layer and a seed layer in addition to the copper layer. If needed, a diffusion barrier layer may be deposited before forming another interconnect level. A passivation layer is deposited over each interconnect level.

The interconnect level is typically formed over a layer of dielectric material with contacts formed therein. The interconnect is in electrical contact with at least one underlying metal feature (window, via) formed in the underlying dielectric layer. In the process of the present invention, the metal features in the underlying layer are also formed by electroplating copper.

A number of materials may be used with the present invention. In general, the dielectric layer is typically either silicon nitride, silicon dioxide (doped or undoped), silicon oxynitride, fluoropolymer, polyaryl ether, or polyimide. The interconnect metal is copper.

Since copper has a tendency to diffuse into dielectric materials generally and silicon dioxide in particular, a layer of material that acts as a barrier to diffusion is required. This layer can be formed by either deposition of a barrier layer prior to electroplating copper onto the substrate, or by outdiffusion from the copper itself. If the barrier layer is a separate layer of material, examples include silicon nitride, phosphosilicate glass (PSG), silicon oxynitride, aluminum oxide ($Al_xO_y$), tantalum, titanium nitride, niobium, or molybdenum. These material are deposited by conventional expedients such as CVD or PVD.

The copper layer is deposited by first determining the thickness of the dual copper layer. Once the overall thickness of the copper layer is determined, the thickness of the vapor deposited layer and the thickness of the electroplated layer are selected so that the recrystallization of the electroplated layer serves to drive the recrystallization of the vapor-deposited copper from its as-deposited small grain state (about 0.1 µm to 0.2 µm) to a large grain state ($\geq 1$ µm).

In order to effect recrystallization, the electroplated copper layer is required to have a thickness of at least 300 nm. Copper layers thinner than 300 nm will not recrystallize to a large grain state at room temperature. The thickness of the electroplated layer (X) and the thickness of the vapor-deposited layer (Y) are selected so that the ratio of the two thicknesses (X:Y) is in the range of 1:0.5 to 1:2. The recrystallization occurs at temperatures as low as room temperature (about 25° C.). It is advantageous if recrystallization occurs at low temperatures in the range of about 25° C. to about 300° C. For recrystallization to occur at room temperature, the ratio X:Y is in the range of 1:0.5 to less than 1:1.

The rate of recrystallization is faster at elevated temperatures. The recrystallization rate is also affected by the thickness of the vapor-deposited copper layer. Generally, the recrystallization rate is inversely proportional to the thickness of the vapor-deposited layer. Since the thickness of the electroplated layer is at least about 300 nm, the thickness of the vapor deposited layer is at least about 150 nm (the thickness of the vapor-deposited layer is at least half the thickness of the electroplated layer).

EXAMPLE 1

A 0.5 µm thick layer of silicon was dioxide formed on 200 mm silicon wafers. The silicon dioxide layer was formed from PETEOS (plasma enhanced tetraethyl orthosilicate). A total of 22 samples were prepared.

A 30 nm-thick layer of tantalum was formed on the oxide using PVD. The tantalum was a barrier to the diffusion of copper into the oxide and an adhesion layer. A layer of copper was then formed over the layer of tantalum using PVD. The thickness of the PVD copper layer was varied among the samples. The thicknesses of the PVD copper layer are reported in Table 1 below. The copper layer served as an electrode for the subsequent electrodeposition of copper. The tantalum and copper films were formed sequentially on the wafers, without a vacuum break, by HCM (hollow cathode magnetron) sputtering in an Inova cluster deposition tool from Novellus of San Jose, Calif. The tantalum was deposited using 15 kW power and direct current. The deposition pressure was 2 mTorr and the flow rate of argon and was 35 sccm. The wafer temperature was −20° C. The copper was deposited using 30 kW of power and direct current. The deposition pressure was 5 mTorr and the flow rate of argon was 35 sccm. The wafer temperature was below room temperature and in the range of about −20° C. to about −30° C.

The copper was electroplated onto the wafers using a Sabre™ wafer plating system from Novellus of San Jose, Calif. The wafers were placed in an CUBATH® SC bath that is commercially obtained from Enthone. The bath had a copper sulfate/sulfuric acid plating chemistry. A DC current of 7 Amps was used to electroplate the copper onto the 200 mm substrate. Copper was plated on the sampler to a coulometric equivalent of the thickness listed in Table 1. The copper films, as plated, were observed to be fine-grained and highly reflective, with a uniform grain size of about 0.1 µm to about 0.2 µm.

The grain size of the copper films was observed to increase over time. At room temperature, the grain size of the unannealed copper films increased from an as-deposited average diameter of 0.1 µm to 0.2 µm. Over a period of hours to weeks, the grain size of the electroplated copper was observed to increase to greater than 1 µm at a rate that was inversely proportional to the thickness of the copper layer. The increase in grain size did not occur uniformly. The grain size increase began at isolated points (nucleation sites) in the film and the size of the sites and the number of sites was observed to increase over time.

TABLE 1

| PVD Copper Layer Thickness (µm) | Electroplated Copper Layer Thickness (µm) | Percent Recrystallization of the Dual Layer at Room Temperature | Percent Recrystallization of the Dual Layer after 300°, 30 min Anneal |
|---|---|---|---|
| 0.3 | 0.5 | 14 | 100 |
| 0.3 | 1 | 92 | 100 |
| 0.3 | 2 | 99 | 100 |
| 0.3 | 3 | 99 | 100 |
| 1.0 | 0.25 | 7 | 100 |
| 1.0 | 0.5 | 12 | 100 |
| 1.0 | 0.75 | 47 | 100 |
| 1.0 | 1 | 69 | 100 |
| 1.0 | 2 | 92 | 100 |
| 0.75 | 1 | 82 | 100 |
| 1.25 | 1 | 63 | 100 |
| 1.5 | 1 | 45 | 100 |
| 1.75 | 1 | 47 | 100 |
| 2 | 1 | 31 | 100 |

Percent recrystallization is determined by the relationship:

$$\% \text{ recrystallization} = \frac{R_i - R_t}{R_i - R_f} \times 100$$

$R_i$ is the initial (as-plated) value of the sheet resistance, $R_f$ if the final value of the sheet resistance after annealing and $R_t$ is the value of time t. Time t is the point in time at which the change in sheet resistance levels off as a function of time (at room temperature).

EXAMPLE 2

A 200 mm diameter silicon wafer was prepared as described in Example 1. First, a 0.5 µm thick layer of silicon dioxide was formed (from PETEOS) on the cleaned silicon wafer. Next, a 30 nm-thick layer of tantalum was deposited on the oxide using PVD. Then a 100 nm thick layer of Cu was deposited over the layer of tantalum (again using PVD).

A 1 µm thick layer of copper was then electroplated onto the wafers as described in Example 1. The copper films, as plated, were observed to be fine-grained and highly reflective, with a uniform grain size of about 0.1 µm to about 0.2 µm.

Immediately after plating, the resulting copper-plated wafer was transferred to the PVD deposition system. A 0.3 µm thick layer of Cu was deposited by PVD over the electroplated copper.

At room temperature, the grain size of the combined copper films increased from an as-deposited average diameter of 0.1 µm to 0.2 µm. Over a period of hours to weeks, the grain size of the PVD and electroplated copper films was observed to increase to greater than 1 µm. This demonstrates the influence of the recrystallization in the electroplated Cu film on grain growth from an overlying PVD film. Consequently, the presence of an adjacent PVD copper layer affects recrystallization of the electroplated copper layer, whether deposited under the electroplated copper layer, as in Example 1, or over the electroplated copper layer, as in this Example underlying film such as in Example 1.

TABLE 2

| PVD Cu Layer Thickness (µm) | Electroplated Cu Layer Thickness (µm) | PVD Cu Layer Thickness (µm) | Percent Recrystallization at Room Temperature | Percent Recrystallization after 300°, 30 min Anneal |
|---|---|---|---|---|
| 0.1 | 1 | 0.3 | 100 | 100 |

The present invention has been described in terms of certain embodiments and examples. These embodiments and examples are provided to further describe the invention. One skilled in the art will appreciate that modifications to the embodiments and examples provided herein are possible without departing from the spirit and scope of the invention, which is defined in the appended claims.

What is claimed is:

1. A process for device fabrication comprising:
    forming a copper interconnect layer on a substrate wherein the copper interconnect layer is a dual layer of copper having a vapor-deposited copper layer and an electroplated copper layer wherein the thickness of the electroplated copper layer is selected to effect recrystallization of the vapor-deposited copper layer having an average pin size of about 0.1 µm to about 0.2 µm by selecting an overall thickness for the copper interconnect layer, selecting a thickness for the electroplated layer wherein the thickness of the electroplated layer is at least about 0.3 µm and selecting a thickness for the vapor deposited layer such that the ratio of the thickness of the electroplated copper layer to the thickness of the vapor deposited layers is in the range of about 1 to 0.5 to about 1 to 2.

depositing the vapor deposited layer;

depositing the electroplated layer; and recrystallizing tie dual copper layer to increase the average grain size of the dual copper layer to at least 1 mm in at least one dimension at a temperature of less than about 300° C.

2. The process of claim 1 wherein the vapor-deposited copper layer is deposited by a vapor-deposition technique selected from the group consisting of plasma vapor deposition and chemical vapor deposition.

3. The process of claim 1 wherein the electroplated copper is deposited from copper electroplating bath that contains organic additives.

4. The process of claim 1 wherein the dual copper layer is recrystallized at ambient temperature.

5. The process of claim 1 further comprising forming a trench in a layer of dielectric material;
    forming a barrier layer in the trench; and
    forming the dual layer of copper on the barrier layer.

6. The process of claim 5 wherein the barrier layer has a thickness of at least about 10 µm and is selected from the group consisting of tantalum, tantalum nitride and titanium nitride.

7. The process of claim 1 wherein the electroplated copper layer is electroplated on the vapor-deposited copper layer.

8. The process of claim 1 wherein the vapor-deposited copper layer is vapor-deposited on the electroplated copper layer.

9. The process of claim 8 further comprising forming a seed-layer of vapor-deposited copper on the substrate and electroplating the copper layer on the seed layer.

* * * * *